(12) United States Patent
Lin et al.

(10) Patent No.: US 7,956,150 B2
(45) Date of Patent: Jun. 7, 2011

(54) AMIDE-SUBSTITUTED SILICONES AND METHODS FOR THEIR PREPARATION AND USE

(75) Inventors: Zuchen Lin, Midland, MI (US); Bianxiao Zhong, Midland, MI (US)

(73) Assignee: Dow Corning Corporation, Midland, MI (US)

(*) Notice: Subject to any disclaimer, the term of this patent is extended or adjusted under 35 U.S.C. 154(b) by 960 days.

(21) Appl. No.: 11/660,256

(22) PCT Filed: Jun. 30, 2005

(86) PCT No.: PCT/US2005/023482
§ 371 (c)(1),
(2), (4) Date: Feb. 15, 2007

(87) PCT Pub. No.: WO2006/065282
PCT Pub. Date: Jun. 22, 2006

(65) Prior Publication Data
US 2008/0063879 A1   Mar. 13, 2008

Related U.S. Application Data

(60) Provisional application No. 60/636,837, filed on Dec. 16, 2004, provisional application No. 60/679,142, filed on May 9, 2005.

(51) Int. Cl.
*C08G 77/26* (2006.01)
(52) U.S. Cl. .............................. 528/25; 528/31; 554/68
(58) Field of Classification Search .................. None
See application file for complete search history.

(56) References Cited

U.S. PATENT DOCUMENTS

| | | | |
|---|---|---|---|
| 3,159,601 A | 12/1964 | Ashby et al. |
| 3,220,972 A | 11/1965 | Lamoreaux et al. |
| 3,296,291 A | 1/1967 | Chalk et al. |
| 3,419,593 A | 12/1968 | Willing et al. |
| 3,516,946 A | 6/1970 | Modic et al. |
| 3,814,730 A | 6/1974 | Karstedt et al. |
| 3,989,668 A | 11/1976 | Lee et al. |
| 4,299,715 A | 11/1981 | Whitfield et al. |
| 4,624,794 A | 11/1986 | Cooke et al. |
| 4,766,176 A | 8/1988 | Lee et al. |
| 4,784,879 A | 11/1988 | Lee et al. |
| 4,861,906 A | 8/1989 | Varaprath et al. |
| 5,017,654 A | 5/1991 | Togashi et al. |
| 5,036,117 A | 7/1991 | Chung et al. |
| 5,082,735 A | 1/1992 | Revis et al. |
| 5,175,325 A | 12/1992 | Brown et al. |
| 5,904,796 A | 5/1999 | Freuler et al. |
| 5,912,805 A | 6/1999 | Freuler et al. |
| 5,929,164 A | 7/1999 | Zhang et al. |
| 5,930,893 A | 8/1999 | Eaton et al. |
| 5,950,066 A | 9/1999 | Hanson et al. |
| 6,054,198 A | 4/2000 | Bunyan et al. |
| 6,136,758 A | 10/2000 | Yamada et al. |
| 6,169,142 B1 | 1/2001 | Nakano et al. |
| 6,286,212 B1 | 9/2001 | Eaton et al. |
| 2003/0194537 A1 | 10/2003 | Bhagwagar et al. |

FOREIGN PATENT DOCUMENTS

| | | |
|---|---|---|
| EP | 0 347 895 B1 | 11/1993 |
| GB | 788984 | 1/1958 |
| GB | 882059 | 11/1961 |
| GB | 882061 | 11/1961 |
| GB | 1117043 | 6/1968 |
| GB | 1188212 | 4/1970 |
| JP | 5-209130 | * 8/1993 |
| JP | 7-196671 | * 8/1995 |

OTHER PUBLICATIONS

Abstract for JP 5-209130.*
Abstract for 7-196671.*
Machine-generated translation of JP 7-196671.*
Zweifel, Hans, "Effect of Stabilization of Polypropylene During Processing and Its Influence on Long-Term Behavior under Thermal Stress," Polymer Durability, American Chemical Society, vol. 24, pp. 375-396, 1996.

* cited by examiner

*Primary Examiner* — Marc S Zimmer
(74) *Attorney, Agent, or Firm* — Erika Takeuchi

(57) ABSTRACT

A composition includes: (A) an amide-substituted silicone and (B) a thermally conductive filler. The composition may be used as a thermal interface material for dissipating heat from electronic devices.

7 Claims, 2 Drawing Sheets

AMIDE-SUBSTITUTED SILICONES AND METHODS FOR THEIR PREPARATION AND USE

CROSS REFERENCE TO RELATED APPLICATIONS

This application is a U.S. national stage filing under 35 U.S.C. §371 of PCT Application No. PCT/US05/23482 filed on 30 Jun. 2005, which claims priority under 35 U.S.C. §119 (e) to U.S. Provisional Patent Application Ser. No. 60/636,837 filed on 16 Dec. 2004, and this application also claims priority under 35 U.S.C. §119 (e) to U.S. Provisional Patent Application Ser. No. 60/679,142 filed on 9 May 2005. PCT Application No. PCT/US05/23482, U.S. Provisional Patent Application Ser. No. 60/636,837 and U.S. Provisional Patent Application Ser. No. 60/679,142 are hereby incorporated by reference.

FIELD OF THE INVENTION

This invention relates to an amide-substituted silicone and methods for its preparation and use. This invention further relates to a composition including the amide-substituted silicone and a thermally conductive filler. The composition may be a grease or a phase change material, and the composition may be used as a thermal interface material ("TIM").

BACKGROUND

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM. The lower the thermal impedance of the medium, the greater the flow of heat from the electronic component to the heat sink.

Surfaces of the electronic component and the heat sink are typically not completely smooth; therefore, it is difficult to achieve full contact between the surfaces. Air spaces, which are poor thermal conductors, appear between the surfaces and increase impedance. These spaces can be filled by inserting a TIM between the surfaces. Therefore, there is a continuing need for suitable TIMs.

SUMMARY OF THE INVENTION

This invention relates to an amide-substituted silicone and methods for its preparation and use. This invention further relates to a composition comprising an amide-substituted silicone and a thermally conductive filler. This invention further relates to methods and devices in which the composition may be used.

DETAILED DESCRIPTION OF THE PREFERRED EMBODIMENTS OF THE INVENTION

All amounts, ratios, and percentages are by weight unless otherwise indicated. The following is a list of definitions, as used herein.

Definitions and Usage of Terms

"A" and "an" each mean one or more.

"Amide-substituted silicone" means a polymer having a backbone made up of silicon and oxygen atoms with an average of at least one amide-functional substituent bonded to a silicon atom, per molecule.

"Combination" means two or more items put together by any method.

"Softening temperature" means a temperature or temperature range evidencing a transition from a solid, crystalline, or glassy phase to a semi-solid phase, which can be characterized as exhibiting intermolecular chain rotation.

"Substituted" means one or more hydrogen atoms bonded to a carbon atom has been replaced with another substituent. Substituents are exemplified by, but not limited to, halogen atoms, such as chlorine, fluorine, bromine, and iodine; organofunctional groups such as alkyl groups, alkoxy groups, amide-functional groups, amine-functional groups, carbonyl groups, and cyano-functional groups.

"Surface treated" means that all, or a portion of, reactive groups on a filler particle have been rendered unreactive by any convenient chemical or unreactive means.

Composition

The composition of this invention may be a grease or a phase change material. The composition comprises an amide-substituted silicone and a thermally conductive filler.

Amide-Substituted Silicone

Ingredient (A) is an amide-substituted silicone containing, on average, at least one silicon-bonded amide-functional group per molecule. Alternatively, the polyorganosiloxane contains, on average, at least two silicon-bonded amide-functional groups per molecule. Alternatively, the polyorganosiloxane contains, on average, at least three silicon-bonded amide-functional groups per molecule. Alternatively, the polyorganosiloxane contains, on average, one to six silicon-bonded amide-functional groups per molecule. Alternatively, the polyorganosiloxane contains, on average, one to three silicon-bonded amide-functional groups per molecule.

Ingredient (A) may comprise a single amide-substituted silicone. Alternatively, ingredient (A) may comprise a combination comprising two or more amide-substituted silicones, where the amide-substituted silicones in the combination differ in at least one of the following properties: structure, viscosity, average molecular weight, siloxane units, and sequence. Ingredient (A) may be a liquid at 25° C. or a solid at 25° C. Ingredient (A) may have unit formula: $(R^2{}_aR^1{}_{3-a}SiO_{1/2})_u(R^2{}_bR^1{}_{2-b}SiO_{2/2})_v(R^2{}_cR^1{}_{1-c}SiO_{3/2})_w(R^1{}_3SiO_{1/2})_x$ $(R^1{}_2SiO_{2/2})_y(R^1SiO_{3/2})_z(SiO_{4/2})_{1-u-v-w-x-y-z}$. In this formula, a may have a value ranging from 0 to 1, b may have a value ranging from 0 to 1, c may have a value ranging from 0 to 1, (u+x) may have a value ranging from 0 to 0.4, (v+y) may have a value ranging from 0.6 to 1, and (w+z) may have a value ranging from 0 to 0.1. Alternatively, (u+x) may have a value ranging from 0.02 to 0.15 and (v+y) may have a value ranging from 0.85 to 0.98.

Each $R^1$ is independently a monovalent hydrocarbon group. Monovalent hydrocarbon groups for $R^1$ may be linear, branched, cyclic, or aromatic. Monovalent hydrocarbon groups for $R^1$ may be substituted or unsubstituted. Suitable hydrocarbon groups include, but are not limited to, aliphatically unsaturated hydrocarbon groups and hydrocarbon groups free of aliphatic unsaturation. Aliphatically unsaturated hydrocarbon groups are exemplified by alkenyl groups such as vinyl, allyl, butenyl, pentenyl, and hexenyl. Hydrocarbon groups free of aliphatic unsaturation are exemplified by alkyl groups such as methyl, ethyl, propyl, and butyl, pentyl, and hexyl; cycloalkyl groups such as cyclopentyl and cyclohexyl; and aryl groups such as phenyl. Alternatively, each $R^1$ is independently an alkyl group or an alkenyl group. Alternatively, each $R^1$ is independently an alkyl group. Alternatively, each $R^1$ is independently an alkyl group of 1 to 4 carbon atoms.

Each $R^2$ is independently an alkyl group having 5 to 30 carbon atoms or an amide-functional group of formula:

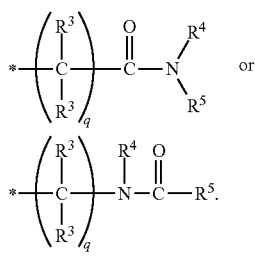

In the formulae above, 0 to 70 mole % of $R^2$ groups may be alkyl groups and 30 to 100 mole % of $R^2$ groups may be amide-functional groups. Each $R^3$ is independently a hydrogen atom, a halogen atom, or a monovalent organic group. Monovalent organic groups are exemplified by alkoxy groups (e.g., methoxy, ethoxy, propoxy, or butoxy) and alkyl groups (e.g., methyl, ethyl, propyl, or butyl). Halogen atoms are exemplified by chlorine, fluorine, bromine, and iodine. Alternatively, each $R^3$ may be a hydrogen atom. Alternatively, each $R^3$ may be independently a hydrogen atom, a methoxy group, or a methyl group. Each $R^4$ may be independently a hydrogen atom or a monovalent hydrocarbon group having 1 to 12 carbon atoms. Each $R^5$ is independently a monovalent hydrocarbon group having 1 to 12 carbon atoms or a group of formula $-(CR^3_2)_rR^1$, where r has a value ranging from 5 to 29. Examples of $R^4$ and $R^5$ may be monovalent hydrocarbon groups exemplified above for $R^1$. $R^4$ and $R^5$ may be linear, branched, cyclic, or aromatic. $R^4$ and $R^5$ may be substituted or unsubstituted. In the formula above q may have a value ranging from 2 to 29, alternatively 2 to 24, alternatively 2 to 16, alternatively 10 to 29, alternatively 10 to 24, alternatively 10 to 16.

Suitable amide-substituted silicones for ingredient (A) may comprise linear, branched, cyclic, or resinous structures, or combinations thereof. Linear amide-substituted silicones suitable as ingredient (A) may comprise:

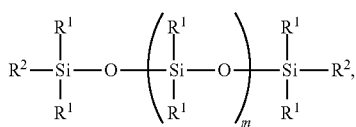

-continued

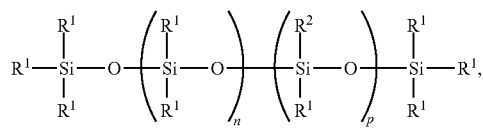

or a combination thereof. Cyclic amide-substituted silicones for ingredient (A) may comprise:

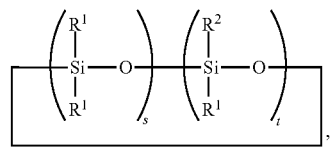

where $R^1$ and $R^2$ are as described above. Alternatively, a combination of linear and cyclic amide-substituted silicones may be used as ingredient (A).

In the formula above m may have a value ranging from 4 to 100. In the formula above n may have a value ranging from 0 to 100. In the formula above p may have a value ranging from 1 to 30, alternatively 1 to 20. In the formula above s may have a value ranging from 0 to 7. In the formula above t may have a value ranging from 1 to 8. The quantity (s+t) may have a value ranging from 3 to 8.

Methods for Preparing Amide-Substituted Silicones

Methods of preparing the amide-substituted silicone having the structures exemplified above include a method comprising: 1) heating, in an inert atmosphere, an amine and a terminally aliphatically unsaturated acid, an acid anhydride, or an acyl chloride at a temperature ranging from 140° C. to 260° C., alternatively at least 160° C., and alternatively 160° C. to 260° C., and alternatively 200° C. to 260° C. to form an amide, and 2) hydrosilylation of a polyorganohydrogensiloxane having at least one silicon bonded hydrogen atom with the amide of step 1) and optionally a terminal alkene having 5 to 30 carbon atoms in the presence of a platinum group metal catalyst. Step 2) may be performed by heating at a temperature ranging from 25° C. to 260° C. For example, in step 1) an amine of the formula

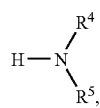

may be combined with an acid of the formula

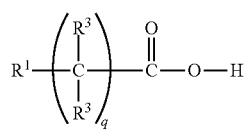

to form an amide of formula

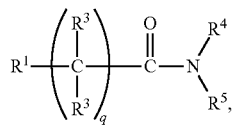

where $R^1$, $R^4$, $R^5$, and q are as described above. Without wishing to be bound by theory, it is thought that heating at a temperature of at least 160° C., alternatively 160° C. to 260° C., may increase reaction yield.

The amine used in step 1) is exemplified by, but not limited to, 2-ethylhexylamine, phenethylamine, 2,3-dimethylcyclohexylamine, dipentylamine, dihexylamine, octylamine, dioctylamine, dodecylamine, didodecylamine, hexadecylamine, octadecylamine, and combinations thereof. The acid, acid anhydride, or acyl chloride used in step 1) is exemplified by, but not limited to, undecylenic acid, or 10-undecenoyl chloride.

Optionally, the product of step 1) can be purified before step 2), for example, by vacuum distillation. Optionally, the product of step 2) can be purified, for example, by vacuum strip at elevated temperatures. Either of the reactants in step 1) can be in excess if its boiling point is lower than the other reactant. The ratio of one reactant to the other may range from 0.9 to 1.1 in step 2). Either of the reactants in step 2) can be in excess, however, molar equivalents of the reactants in step 2) may be used to minimize unreacted reactants in the product.

In step 2), the amide formed in step 1) and optionally a terminal alkene having 5 to 30 carbon atoms may be reacted with a polyorganohydrogensiloxane, which contains at least one silicon-bonded hydrogen atom per molecule. The polyorganohydrogensiloxane may have unit formula: $(H_aR^1_{3-a}SiO_{1/2})_u(H_bR^1_{2-b}SiO_{2/2})_v(H_cR^1_{1-c}SiO_{3/2})_w(R^1_3SiO_{1/2})_x(R^1_2SiO_{2/2})_y(R^1SiO_{3/2})_z(SiO_{4/2})_{1-u-v-w-x-y-z}$, where $R^1$, a, b, c, u, v, w, x, y, and z are as described above.

Alternatively, the polyorganohydrogensiloxane may have a formula selected from:

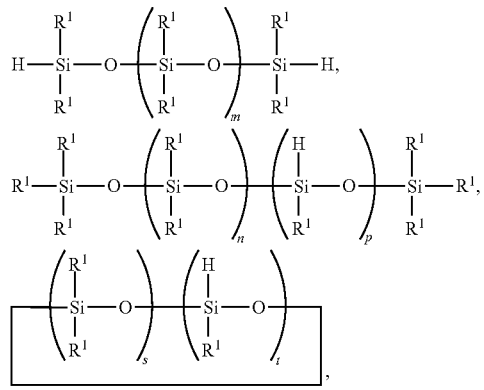

or a combination thereof, where $R^1$, m, n, p, s, and t are as described above. Examples of terminal alkenes that may be used in step 2) include 1-hexene, 1-octene, 1-decene, 1-dodecene, 1-hexadecene, 1-octadecene, 1-eicosene, 1-tetracosene, 1-octacosene, 1-triacosene, and combinations thereof.

Suitable hydrosilylation catalysts for use in step 2) are known in the art and commercially available. The hydrosilylation is added in an amount of 0.1 to 1000 ppm of platinum group metal based on the weight of the reactants in step 2), alternatively 10 to 100 ppm platinum. The hydrosilylation catalyst may comprise a platinum group metal selected from platinum, rhodium, ruthenium, palladium, osmium or iridium metal or organometallic compound thereof, or a combination thereof. The hydrosilylation catalyst is exemplified by compounds such as chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176 and the references cited therein; and U.S. Pat. No. 5,017,654.

An alternative method of preparing the amide-substituted silicone having the structures exemplified above comprises heating an amine functional silicone with a carboxylic acid at a temperature of 140° C. to 260° C., alternatively at least 160° C., and alternatively 160° C. to 260° C. The amine-substituted silicone may have unit formula: $(R^{2'}_aR^1_{3-a}SiO_{1/2})_u(R^{2'}_bR^1_{2-b}SiO_{2/2})_v(R^{2'}_cR^1_{1-c}SiO_{3/2})_w(R^1_3SiO_{1/2})_x(R^1_2SiO_{2/2})_y(R^1SiO_{3/2})_z(SiO_{4/2})_{1-u-v-w-x-y-z}$, where a, b, c, u, v, w, x, y, z, and $R^1$ are as described above, and each $R^{2'}$ is independently an amine group or an alkyl group having 5 to 30 carbon atoms, with the proviso that 1 mole % to 100 mole % of $R^{2'}$ is the amine-functional group. Alternatively, the amine-substituted silicone may have a formula selected from:

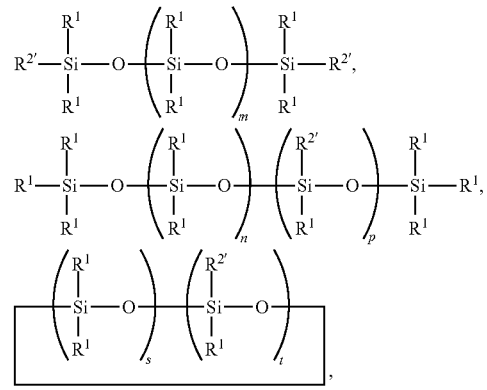

or a combination thereof, where m, n, p, s, t, $R^1$, and $R^{2'}$ are as described above.

Another alternative method of preparing the amide-substituted silicone having the structures exemplified above comprises heating a carboxylic acid-functional silicone with an amine at a temperature of 140° C. to 260° C., alternatively at least 160° C., and alternatively 160° C. to 260° C. The carboxylic acid-functional silicone may have unit formula: $(R^{2''}_aR^1_{3-a}SiO_{1/2})_u(R^{2''}_bR^1_{2-b}SiO_{2/2})_v(R^{2''}_cR^1_{1-c}SiO_{3/2})_w(R^1_3SiO_{1/2})_x(R^1_2SiO_{2/2})_y(R^1SiO_{3/2})_z(SiO_{4/2})_{1-u-v-w-x-y-z}$, where a, b, c, u, v, w, x, y, z, and $R^1$ are as described above, and each $R^{2''}$ is independently a carboxylic acid group or an alkyl group having 5 to 30 carbon atoms, with the proviso that 1 mole % to 100 mole % of $R^{2''}$ is the carboxylic acid-functional group. Alternatively, the acid-substituted silicone may have a formula selected from:

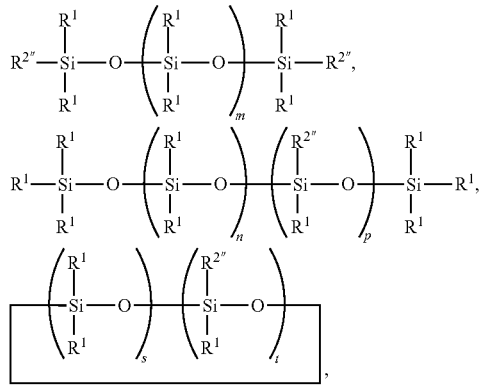

or a combination thereof. Examples of suitable amines include, but are not limited to, 2-ethylhexylamine, phenethylamine, 2,3-dimethylcyclohexylamine, dipentylamine, dihexylamine, octylamine, dioctylamine, dodecylamine, didodecylamine, hexadecylamine, octadecylamine, and combinations thereof.

The amount of ingredient (A) in the composition depends on various factors including the amide-substituted silicone selected for ingredient (A), the thermally conductive filler selected for ingredient (B), and any additional ingredients that may be added. However, the amount of ingredient (A) may range from 1% to 65%, alternatively 5% to 10%, alternatively 3% to 30% alternatively 4% to 8% based on the weight of the composition.

Thermally Conductive Filler

Ingredient (B) is a thermally conductive filler. The amount of ingredient (B) in the composition depends on various factors including the polyorganosiloxane selected for ingredient (A) and the thermally conductive filler selected for ingredient (B). However, the amount of ingredient (B) may range from 35% to 98%, alternatively 70% to 96%, alternatively 90% to 95%, alternatively 92% to 95.5% based on the weight of the composition.

Ingredient (B) may be both thermally conductive and electrically conductive. Alternatively, ingredient (B) may be thermally conductive and electrically insulating. Ingredient (B) may comprise a metallic filler, an inorganic filler, a meltable filler, or a combination thereof. Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from the group consisting of aluminum, copper, gold, nickel, silver, and combinations thereof, and alternatively aluminum. Suitable metallic fillers are further exemplified by particles of the metals listed above having layers on their surfaces selected from the group consisting of aluminum nitride, aluminum oxide, copper oxide, nickel oxide, silver oxide, and combinations thereof. For example, the metallic filler may comprise aluminum particles having aluminum oxide layers on their surfaces. Inorganic fillers are exemplified by aluminum oxide, beryllium oxide, boron nitride, magnesium oxide, silicon carbide, tungsten carbide, zinc oxide, and combinations thereof. Alternatively, inorganic fillers are exemplified by aluminum oxide, zinc oxide, and combinations thereof. Meltable fillers may comprise Ga, In, Sn, or an alloy thereof. The meltable filler may optionally further comprise Ag, Bi, Cd, Cu, Pb, Zn, or a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Pb alloys, Sn—Ag—Cu alloys, Sn—Ag alloys, Sn—Ag—Cu—Zn alloys, and combinations thereof. The meltable filler may have a melting point of up to 250° C., alternatively up to 225° C. The meltable filler may have a melting point of at least 50° C., alternatively at least 150° C. The meltable filler may be a eutectic alloy, a non-eutectic alloy, or a pure metal. Meltable fillers are commercially available.

Aluminum fillers are commercially available, for example, from Toyal America, Inc. of Naperville, Ill., U.S.A. and Valimet Inc., of Stockton, Calif., U.S.A. Silver filler is commercially available from Metalor Technologies U.S.A. Corp. of Attleboro, Mass., U.S.A.

Thermally conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Zinc oxides, such as zinc oxides having trademarks KADOX® and XX®, are commercially available from Zinc Corporation of America of Monaca, Pa., U.S.A.

The shape of the thermally conductive filler particles is not specifically restricted, however, rounded or spherical particles may prevent viscosity increase to an undesirable level upon high loading of the thermally conductive filler in the composition.

Ingredient (B) may be a single thermally conductive filler or a combination of two or more thermally conductive fillers that differ in at least one property such as particle shape, average particle size, particle size distribution, and type of filler. For example, it may be desirable to use a combination of inorganic fillers, such as a first aluminum oxide having a larger average particle size and a second aluminum oxide having a smaller average particle size. Alternatively, it may be desirable, for example, use a combination of an aluminum oxide having a larger average particle size with a zinc oxide having a smaller average particle size. Alternatively, it may be desirable to use combinations of metallic fillers, such as a first aluminum having a larger average particle size and a second aluminum having a smaller average particle size. Alternatively, it may be desirable to use combinations of metallic and inorganic fillers, such as a combination of aluminum and aluminum oxide fillers; a combination of aluminum and zinc oxide fillers; or a combination of aluminum, aluminum oxide, and zinc oxide fillers. Use of a first filler having a larger average particle size and a second filler having a smaller average particle size than the first filler may improve packing efficiency, may reduce viscosity, and may enhance heat transfer.

The average particle size of the thermally conductive filler will depend on various factors including the type of thermally conductive filler selected for ingredient (B) and the exact amount added to the composition, however, the thermally conductive filler may have an average particle size of 0.1 to 80 micrometers, alternatively 0.1 to 50 micrometers, and alternatively 0.1 to 10 micrometers.

Additional Ingredients

The composition may optionally further comprise one or more additional ingredients. Examples of suitable additional ingredients include (C) a treating agent for the filler, (D) an antioxidant, (E) a pigment, (F) a spacer, (G) a vehicle, (H) a wetting agent, (I) an antifoaming agent, (J) a flame retardant, (K) a rust preventive, (L) an amide described above and formed in step 1) of the method for making an amide-substituted silicone suitable as ingredient (A), (M) a reinforcing filler, (N) a catalyst inhibitor, (O) a matrix material, and a combination thereof.

The thermally conductive filler for ingredient (B) may optionally be surface treated. Additional ingredient (C) is a treating agent. Ingredient (C) may be added to the composition in an amount ranging from 0 to 5%, alternatively 0.1% to 5%, alternatively 0.05% to 4% based on the weight of the composition. Treating agents and treating methods are known in the art, see for example, U.S. Pat. No. 6,169,142 (col. 4, line 42 to col. 5, line 2) and U.S. Pat. No. 6,136,758.

The treating agent may comprise an alkoxysilane having the formula: $R^6_x Si(OR^7)_{(4-x)}$, where x may have a value ranging from 1 to 3, alternatively x is 3. Each $R^6$ is independently a substituted or unsubstituted monovalent hydrocarbon group of 1 to 50 carbon atoms, alternatively 8 to 30 carbon atoms, alternatively 8 to 18 carbon atoms. $R^6$ is exemplified by alkyl groups such as hexyl, octyl, dodecyl, tetradecyl, hexadecyl, and octadecyl; and aromatic groups such as benzyl and phenylethyl. $R^6$ may be saturated or unsaturated, branched or unbranched, and unsubstituted. $R^6$ may be saturated, unbranched, and unsubstituted.

Each $R^7$ is independently an unsubstituted, saturated hydrocarbon group of 1 to 4 carbon atoms, alternatively 1 to 2 carbon atoms. Component C) is exemplified by hexyltrimethoxysilane, octyltriethoxysilane, decyltrimethoxysilane, dodecyltrimethyoxysilane, tetradecyltrimethoxysilane, phenylethyltrimethoxysilane, octadecyltrimethoxysilane, octadecyltriethoxysilane, and combinations thereof.

Alkoxy-functional oligosiloxanes may also be used as treating agents. Alkoxy-functional oligosiloxanes and methods for their preparation are known in the art, see for example, EP 1 101 167 A2. For example, suitable alkoxy-functional oligosiloxanes include those of the formula $(R^8O)_d Si(OSiR^9_2 R^{10})_{4-d}$. In this formula, d is 1, 2 or 3, alternatively d is 3. Each $R^8$ may be an alkyl group. Each $R^9$ is may be independently selected from unsaturated monovalent hydrocarbon groups of 1 to 10 carbon atoms. Each $R^{10}$ may be an unsaturated monovalent hydrocarbon group having at least 10 carbon atoms.

Metal fillers may be treated with alkylthiols such as octadecyl mercaptan; fatty acids such as oleic acid and stearic acid; and a combination thereof.

Treating agents for alumina include alkoxysilyl functional alkylmethyl polysiloxanes (e.g., partial hydrolysis condensate of $R^{11}_e R^{12}_f Si(OR^{13})_{(4-e-f)}$ or cohydrolysis condensates or mixtures), similar materials where the hydrolyzable group would be silazane, acyloxy or oximo. In all of these, a group tethered to Si, such as $R^{11}$ in the formula above, is a long chain unsaturated monovalent hydrocarbon or monovalent aromatic-functional hydrocarbon. $R^{12}$ is a monovalent hydrocarbon group, and $R^{13}$ is a monovalent hydrocarbon group of 1 to 4 carbon atoms. In the formula above e may have a value ranging from 1 to 3. In the formula above f may have a value ranging from 0 to 2. In the formula above the quantity (e+f) is 1, 2, or 3. One skilled in the art could optimize a specific treatment to aid dispersion of the filler without undue experimentation.

Other filler treating agents include alkenyl functional polyorganosiloxanes. Suitable alkenyl functional polyorganosiloxanes include, but are not limited to:

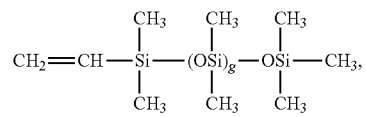

where g has a value up to 1,500.

Additional ingredient (D) is an antioxidant. When present, ingredient (D) may be added to the composition in an amount ranging from 0.001% to 1% based on the weight of the composition. Suitable antioxidants are known in the art and commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyldithiocarbamate, dithiodipropionates, and a combination thereof; and sterically hindered amines such as tetramethyl-piperidine derivatives. Suitable antioxidants and stabilizers are disclosed in Zweifel, Hans, "Effect of Stabilization of Polypropylene During Processing and Its Influence on Long-Term Behavior under Thermal Stress," *Polymer Durability*, Ciba-Geigy AG, Additives Division, CH-4002, Basel, Switzerland, American Chemical Society, vol. 25, pp. 375-396, 1996.

Suitable phenolic antioxidants are known in the art and include vitamin E and IRGANOX® 1010 from Ciba Specialty Chemicals, U.S.A. IRGANOX® 1010 comprises pentaerythriol tetrakis(3-(3,5-di-t-butyl-4-hydroxyphenyl)propionate).

Additional ingredient (E) is a pigment. Examples of suitable pigments include Stan-Tone 50SP01 Green (which is commercially available from PolyOne) and carbon black such as Shawinigan Acetylene black, which is commercially available from Chevron Phillips Chemical Company LP.

Additional ingredient (F) is a spacer. Spacers may comprise organic particles, inorganic particles, or a combination thereof. Spacers may be thermally conductive, electrically conductive, or both. Spacers may have a particle size of 25 micrometers to 250 micrometers. Spacers may comprise monodisperse beads. The amount of ingredient (F) depends on various factors including the distribution of particles, pressure to be applied during placement, and temperature during placement. The composition may comprise 0 to 15%, alternatively 0 to 5% of ingredient (F) added in addition to, or instead of, a portion of ingredient (B). The spacer may be treated with component (C).

Additional ingredient (G) is a vehicle such as a solvent or diluent. Ingredient (G) may be added during preparation of the composition, for example, to aid mixing and delivery. All or a portion of ingredient (G) may additionally be removed after the composition is prepared. Ingredient (G) may comprise an organic solvent, a polyorganosiloxane fluid different from ingredient (A), or a combination thereof.

Additional ingredient (H) is a wetting agent. Suitable wetting agents include the anionic, cationic, and nonionic surfactants known in the art to act as wetting agents. Anionic wetting agents are exemplified by TERGITOL® No. 7, cationic wetting agents are exemplified by TRITON® X-100, and nonionic wetting agents are exemplified by TERGITOL® NR 27.

Additional ingredient (M) is a reinforcing filler that may be added in addition to, or instead of, a portion of ingredient (B). Ingredient (M) can be silica or a chopped fiber, such as chopped KEVLAR®. Without wishing to be bound by theory, it is thought that chopped KEVLAR® improves strength and coefficient of thermal expansion (CTE). Ingredient (M) may also be treated with ingredient (C).

Additional ingredient (N) is a catalyst inhibitor. Ingredient (N) can be an addition reaction catalyst inhibitor. Addition reaction catalyst inhibitors are known in the art and commercially available, see for example, U.S. Pat. No. 5,929,164 (col. 1, line 65 to col. 3, line 65). Without wishing to be bound by theory, it is thought that the catalyst inhibitor prevents crosslinking ingredient (A), for example, when ingredient (A) contains residual hydrosilylation catalyst from its preparation method.

Additional ingredient (O) is matrix material that can be added in addition to, or instead of, a portion of ingredient (A). Ingredient (O) can comprise an organic wax, such as an organic amide wax, a Fischer-Tropsh wax, a polymer compatible with ingredient (A), a hardener, and a combination thereof. Organic waxes are known in the art and commercially available.

The composition described above may be made by mixing all ingredients at ambient or elevated temperature using any convenient mixing equipment, such as a centrifugal mixer (such as a mixer commercially available from Hauschild) or a Baker-Perkins mixer.

When ingredient (C) is present, the composition may optionally be prepared by surface treating ingredient (B) and thereafter mixing the ingredients of the composition. Alternatively, component (C) may be mixed with some or all of the other ingredients simultaneously.

When ingredient (G) is present, the composition can be prepared by mixing all components at ambient or elevated temperature. Some or all of component (G) may optionally be removed after mixing.

Grease

The composition described above may be formulated as a grease or as a PCC. Whether the composition is a grease or a PCC depends on various factors including the selection of ingredient (A). When ingredient (A) is a liquid at 25° C., the composition may be a grease. The grease can be formulated to have a thermal resistance of 0.02° C.·cm²/W to 0.5° C.·cm²/W. Thermal resistance depends on various factors including the amount and type of thermally conductive filler selected for ingredient (B).

When the composition is a grease, in the formulae above for ingredient (A), q may have a value ranging from 2 to 16, m may have a value ranging from 4 to 100, n may have a value ranging from 0 to 100, p may have a value ranging from 1 to 20, s may have a value ranging from 0 to 7, t may have a value ranging from 1 to 8, and (s+t) may have a value ranging from 3 to 8. When the composition is a grease, each $R^2$ is independently an alkyl group having 5 to 16 carbon atoms or an amide-functional group of formula:

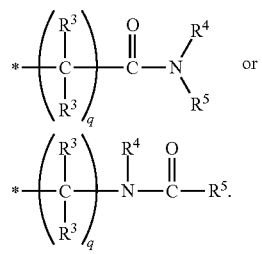

Each $R^4$ may be independently a hydrogen atom or a monovalent hydrocarbon group having 1 to 12 carbon atoms. Each $R^5$ is independently a monovalent hydrocarbon group having 1 to 12 carbon atoms.

The amount of ingredient (A) in the grease depends on various factors including the amide-substituted silicone selected for ingredient (A), the thermally conductive filler selected for ingredient (B), and any additional ingredients that may be added to the grease. However, the amount of ingredient (A) may be 1% to 65%, alternatively 5% to 10%, based on the weight of the grease.

The amount of ingredient (B) in the grease depends on various factors including the polyorganosiloxane selected for ingredient (A) and the thermally conductive filler selected for ingredient (B). However, the amount of ingredient (B) may be 35% to 98%, alternatively 90% to 95%, based on the weight of the grease.

Ingredient (C) may be added to the grease in an amount ranging from 0 to 5%, alternatively 0.1% to 5%, based on the weight of the grease.

Ingredient (D) may be added to the grease in an amount ranging from 0 to 1%, alternatively 0.001% to 1%, alternatively 0.01% to 0.5% based on the weight of the grease. The grease may comprise 0 to 15%, alternatively 0 to 5% of ingredient (F) added in addition to, or instead of, a portion of ingredient (B).

PCC

When the composition is a PCC, ingredient (A) may have a softening temperature ranging 30 to 100° C. The amide-functional group in the formulae above may have the formula:

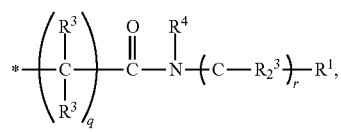

where $R^1$, $R^3$, $R^4$, and r are as described above. Alternatively, each $R^1$ may independently be an alkyl group such as methyl, ethyl, propyl, or butyl. Alternatively, $R^3$ may be a hydrogen atom. Alternatively, $R^4$ may be a hydrogen atom. In the formulae above for ingredient (A), m may have a value ranging from 4 to 100, n may have a value ranging from 0 to 100, p may have a value ranging from 1 to 30, s may have a value ranging from 0 to 7, t may have a value ranging from 1 to 8, (s+t) may have a value ranging from 3 to 8, q may have a value ranging from 2 to 29, r may have a value ranging from 5 to 29, with the proviso that (q+r) may have a value ranging from 19 to 39. This amide-substituted silicone may be prepared by a method comprising a hydrosilylation reaction of a composition including:

a) an organohydrogensiloxane selected from
 i) $HSi(R^1)_2O[Si(R^1)_2O]_mSi(R^1)_2H$,
 ii) $R^1{}_3SiO[Si(R^1)_2O]_n[Si(R^1)(H)O]_pSiR^1{}_3$,
 iii) $[Si(R^1)_2O]_s[Si(R^1)(H)O]_t$,
 or a combination thereof;
b) an amide of formula $CH_2=CH(CR^3{}_2)_{q-2}C(O)NH(CR^3{}_2)_r R^1$; and
c) a platinum group metal catalyst, where $R^1$, $R^2$, m, n, p, s, t, q, and r are as described above.

The amount of ingredient (A) added to the PCC may range from 3% to 30%, alternatively 4% to 8% based on the weight of the PCC.

The amount of ingredient (B) may range from 70% to 96%, alternatively 92% to 95.5% based on the weight of the PCC. If the amount of component B) is too low, the PCC may have insufficient thermal conductivity for some applications.

The amount of ingredient (C) may range from 0% to 4%, alternatively 0.05% to 4% based on the weight of the PCC.

The amount of ingredient (D) may range from 0 to 1%, alternatively 0.001% to 1%, alternatively 0.01% to 0.5% based on the weight of the PCC.

The PCC can contain 0 to 15%, alternatively 0 to 5% of ingredient (F), added in addition to, or instead of, a portion of ingredient (B).

Methods of Use of the Composition

The composition described above can be used as an interface material, such as a thermal interface material (TIM). The interface material may have any convenient configuration, and one skilled in the art would be able to control the configuration by appropriate selection of ingredients (A) and (B), and any additional ingredients. When the composition is a PCC, the PCC can be formulated to be form stable under ambient conditions. The PCC can be formulated to be self-supporting under ambient conditions. The PCC may optionally be provided as a flat member, such as a pad, tablet, sheet, or tape. Alternatively, the PCC may be provided as a hemispherical nubbin, a convex member, a pyramid, or a cone. The PCC may be formulated to be a tacky or tack-free solid under ambient conditions.

The PCC may optionally have a removable release sheet over a surface of the PCC. A release sheet can be used when the PCC is tacky at ambient conditions. The release sheet can be, for example, a wax- or silicone-coated paper or plastic sheet having a relatively low surface energy. The PCC may be applied to a face stock, liner, or other release sheet by any conventional means such as a direct process, e.g., spray-coating, knife-coating, roller coating, casting, drum coating, dipping or the like or an indirect transfer process using a release sheet. A vehicle may be added to the PCC before application, and thereafter the vehicle is removed to leave an adherent film, coating, or residue of the PCC on the release sheet.

The PCC may optionally be coated on a substrate, e.g., when the PCC lacks sufficient form stability during processing. The substrate can be a thermally conductive material, an electrically conductive material, or both. The substrate can be, for example, a metal foil or perforated metal foil (i.e., a mesh), such as gold, silver, copper, or aluminum foil; polyimide; polyamide; KAPTON® from E. I. Du Pont de Nemours and Company, Inc., of Wilmington, Del., U.S.A.; or polyethylene terephthalate polyester (MYLAR® from E. I. Du Pont de Nemours and Company, Inc., of Wilmington, Del., U.S.A.). The PCC can be coated on one or more surfaces of the substrate. Without wishing to be bound by theory, it is thought that providing a pad comprising a coating of the PCC on one side of a perforated metal foil may provide advantages that the uncoated surface of the perforated metal foil is non-tacky and does not need a liner, after installation and at the operating temperature, the PCC can flow through the holes in the perforated metal foil and contact a surface of the device to be cooled at least partially to lower interfacial thermal resistance, in a re-work process, the heat-sink or spreader can be selectively separated from the device at the foil-device interface. This pad may be fabricated by pressing the perforated metal foil onto a PCC film at an elevated temperature.

Alternatively, the PCC may be coated on one side or more sides of a substrate. Release sheets may be used on the coated side or sides of the coated substrate. This interface material is shown in FIG. 1. In FIG. 1, the interface material 100 comprises a substrate 101, and layers of the PCC described above 102 formed on opposing sides of the substrate 101. Release liners 103 are applied over the exposed surfaces of the PCC 102.

Various interface materials comprising the PCC described above can be prepared. The PCC described above can be used to prepare interface materials by various methods, including those disclosed in U.S. Pat. Nos. 4,299,715 and 5,904,796.

The composition may be interposed along a thermal path between a heat source and a heat spreader. The composition may be interposed between a first heat spreader and a second heat spreader within the thermal path. Alternatively, the composition may be interposed between an electronic component and a first heat spreader within the thermal path. When the composition is a grease, the grease may be interposed by any convenient means, such as wet-dispensing, screen printing, stencil printing, or solvent casting the grease. When the composition is a PCC, the PCC can be interposed by any convenient means, such as applying a form stable PCC or interface material comprising the PCC between the heat source and the heat spreader or heat sink with or without an adhesive or primer, hot-melt dispensing the PCC, or solvent casting the PCC.

The heat source may comprise an electronic component such as a semiconductor, a transistor, an integrated circuit, or a discrete device.

The heat spreader may comprise a thermally conductive plate, a thermally conductive cover, a fan, a circulating coolant system, a heat sink, or a combination thereof. The composition may be used in direct contact with the electronic component and the heat spreader (TIM1). The composition may be applied either to the electronic component and thereafter the heat spreader, or the composition may be applied to the heat spreader and thereafter to the electronic component. Alternatively, the composition may be used in direct contact with a first heat spreader and a second heat spreader (TIM2). The composition may be applied either to the first heat spreader and thereafter the second heat spreader, or the composition may be applied to the second heat spreader and thereafter to the first heat spreader.

When the composition is a PCC, during or after interposing the PCC along the thermal path, the PCC can be heated to a temperature equal to or greater than the softening temperature. Pressure may be applied. The PCC can then be cooled.

This invention further relates to a device comprising:
 a) an electronic component,
 b) a thermal interface material, and
 c) a heat spreader;
where the thermal interface material is interposed between the electronic component and the heat spreader along a thermal path extending from a surface of the electronic component to a surface of the heat spreader, where the thermal interface material comprises the grease described above.

This invention further relates to a device comprising:
a) an electronic component,
b) a first thermal interface material,
c) a first heat spreader,
d) a second thermal interface material, and
e) a second heat spreader;
where the first interface material is interposed between the electronic component and the heat spreader along a thermal path extending from a surface of the electronic component to a surface of the second heat spreader, the second thermal interface material is interposed along the thermal path between the first heat spreader and the second heat spreader, and at least one of the first thermal interface material and the second thermal interface material comprises the composition described above.

FIG. 2 shows a device 200 according to this invention. The device 200 comprises an electronic component (shown as an integrated circuit chip) 203 mounted to a substrate 204 through a die attach adhesive 209. The substrate 204 has solder balls 205 attached thereto through pads 210. A first interface material (TIM1) 206 is interposed between the IC chip 203 and a metal cover 207. The metal cover 207 acts as a heat spreader. A second interface material (TIM2) 202 is interposed between the metal cover 207 and a heat sink 201. Heat moves along a thermal path represented by arrows 208 when the device is operated.

Products and devices may be prepared including the composition described above. For example, the composition described above may be used as or in the thermal interface materials in the devices disclosed in U.S. Pat. Nos. 5,912,805; 5,930,893; 5,950,066; 6,054,198; and 6,286,212 in addition to, or instead of, the interface materials described therein.

EXAMPLES

These examples are intended to illustrate the invention to one skilled in the art and should not be interpreted as limiting the scope of the invention set forth in the claims. Viscosity is measured at 25° C. unless otherwise indicated. "Me" means a methyl group. "$C_{18}Si(OMe)_3$" represents octadecyltrimethoxysilane.

Example 1

Preparation of Amides Having Terminal Double Bonds

Undecylenic acid having the formula $CH_2=CH(CH_2)_8CO_2H$ and amines according to Table 1 are loaded into a glass reactor. The reactor is purged with nitrogen for 10 minutes. The reactor is heated at 200° C. with stirring in a nitrogen stream for 10 hours and the water produced is removed with a water-cooled condenser. The reactor contents are stripped by heating up to 200° C. in 2 torr to remove un-reacted reagents and residual water by-product.

Example 2

Preparation of Amide-Substituted Silicones

The amides prepared in example 1 and polyorganohydrogensiloxanes according to Table 2 are loaded into a glass reactor. The reactor is purged with nitrogen for 10 minutes. The reactor is heated at 100° C. with stirring and under nitrogen. The heat source is removed. Platinum catalyst in an amount sufficient to provide 50 ppm of platinum based on the total weight of the reactants is added with stirring. The temperature is stabilized and the reactor is heated at 120° C. for 1 hour after the temperature is stabilized to complete the reaction. Samples of the products are evaluated on an Advanced Rheometric Expansion System manufactured by Rheometric Scientific to measure viscosity (Eta) at 25° C. at 30 rad using steady rate sweep test at 30-50 rad, 40 mm parallel plate and cup fixture and 0.6 mm gap. The results are shown in Table 2.

Example 3

Preparation and Characterization of Greases

The amide-substituted silicones prepared in example 2, octadecyltrimethoxysilane and fillers are loaded into a 4 ounce mixer cup according to Table 3. The resulting combination is mixed at 3500 rpm on a Hauschild centrifugal mixer until consistent greases are obtained. CB-A20S, CB-A09S and Al-43-ME are alumina fillers obtained from Showa Denko, H-3 and H5 are Aluminum fillers obtained from Valimet, Kadox 911 and XX-503R are Zinc oxide fillers obtained from Zinc Corp. of America, and ABY-499 is an Aluminum filler obtained from Toyal America Inc. Samples of the products were run on an Advanced Rheometric Expansion System manufactured by Rheometric Scientific to measure viscosity (Eta) at 25° C. using steady rate sweep test at 0.1 to 1 rad, 25 mm parallel plate fixture and 0.6 mm gap. The grease samples that could be applied onto the probes of a Hitachi Thermal Resistance System using a syringe are tested for thermal resistance (TR) and bondline thickness (BLT) at 50° C. and under 20 psi. The results are shown in Table 3.

Example 4

Preparation of Amides Having Terminal Double Bonds

Load undecylenic acid ($CH_2=CH(CH_2)_8CO_2H$) and amines according to Table 4 into a glass reactor, purge the reactor with nitrogen for 10 minutes, heat the reactor at 160° C. with stirring and under nitrogen for 2 hours and remove the produced water with a water-cooled condenser, heat at 220° C. under the same conditions for 1 hour to remove more water, heat at 240° C. in 2 torr for 1 hour to remove any volatiles produced. Samples of the products are placed in hermetic pans and run on the Q 1000 differential scanning calorimeter (DSC) from −30 C to 150° C. at 2° C./minute ramp rate to measure melt point. The results are listed in Table 4.

Example 5

Preparation of Amide-Substituted Silicones (ADS)

Load amides and SiH-containing silicones according to Table 5 to a glass reactor, purge the reactor with nitrogen for 10 minutes, heat the reactor to 120° C. with stirring and under nitrogen and then remove the heat source, add Pt catalyst of 50 ppm in Pt based on the total weight of the reactants with stirring, heat the reactor at 120° C. for 1 hour after the temperature is stabilized to complete the reaction. Samples of the products are run on an Advanced Rheometric Expansion System manufactured by Rheometric Scientific to measure complex viscosity (Eta*) in a temperature range of 30 to 90° C. using dynamic T ramp test at 1 rad, 40 mm parallel plate and cup fixture and 0.6 mm gap. The softening temperature of each product is determined using the temperatures at which the Eta* is 10000 poise. The results are shown in Table 5.

Example 6

Preparation of Thermally Conductive Phase Change Compositions

Load amide-substituted silicone, octadecyltrimethoxysilane ($C_{18}Si(OMe)_3$) and fillers to a 4 ounce dental mixer cup according to Table 3, mix them at 3500 rpm on a Hauschild centrifugal mixer for 30 seconds. CB-A20S, CB-A09S and Al-43-ME are $Al_2O_3$ fillers obtained from Showa Denko, H-5 and H10 are Al fillers obtained from Valimet, Kadox 911 is a ZnO filler obtained from Zinc Corp. of America, and ABY-499 is an Al filler obtained from Toyal America Inc. Samples of the products are run on an Advanced Rheometric Expansion System manufactured by Rheometric Scientific to measure complex viscosity (Eta*) at 40° C. and 60° C. using 1 rad frequency, 25 mm parallel plate fixture and 0.6 mm gap. The results are shown in Table 6.

Example 7

Fabrication and Characterization of Thermally Conductive Phase Change Pads

Samples of thermally conductive phase change compositions (PCCs) are placed between two release liners and films 4 to 6 mil in thickness are drawn from them on a hotplate coater at 90° C. Unsupported pads of 1 cm by 1 cm are made and tested for thermal resistance (TR) and bondline thickness (BLT) at 55° C. and under 20 psi on a Hitachi Thermal Resistance System. The results are summarized in Table 7.

Example 8

Fabrication and Characterization of Thermally Conductive Pads Carried on Al Mesh or Foil An Al mesh of 1.5 mil or Al foil of 1 mil is placed between two release liners, and PCC samples are placed both above and under the mesh or foil. Films 5 to 6 mils in thickness are drawn from them on a hotplate coater at 90° C. Pads are cut to 1 cm by 1 cm and tested for thermal resistance (TR) and bondline thickness (BLT) at 55° C. and under 20 psi on a Hitachi Thermal Resistance System. The results are summarized in Table 8.

INDUSTRIAL APPLICABILITY

The composition is suitable for use as a TIM in various electronic devices.

TABLE 1

Preparation of amides (the weight parts of undecylenic acid are fixed at 1).

| Sample | Amine | Wt parts of amine |
|---|---|---|
| 1-1 | 2-ethylhexylamine | 0.702 |
| 1-2 | phenethylamine | 0.658 |
| 1-3 | 2,3-dimethylcyclohexylamine | 0.690 |
| 1-4 | dipentylamine | 0.854 |
| 1-5 | octylamine | 0.702 |

TABLE 2

Preparation of amide-substituted silicones (weight parts of polyorganohydrogensiloxanes are fixed at 1).

| Sample | Polyorganohydrogensiloxane | Amide | Wt parts of amide | Wt parts of 1-dodecene | Product state at 25° C. | Eta at 30S-1, 25° C., Poise |
|---|---|---|---|---|---|---|
| 2-1 | $HSi(Me)_2O[Si(Me)_2O]_{17}Si(Me)_2H$ | 1-1 | 0.394 | 0 | fluid | 8.9 |
| 2-2 | $HSi(Me)_2O[Si(Me)_2O]_{17}Si(Me)_2H$ | 1-2 | 0.384 | 0 | fluid | 6.0 |
| 2-3 | $HSi(Me)_2O[Si(Me)_2O]_{17}Si(Me)_2H$ | 1-3 | 0.392 | 0 | fluid | 18.3 |
| 2-4 | $HSi(Me)_2O[Si(Me)_2O]_{17}Si(Me)_2H$ | 1-4 | 0.432 | 0 | fluid | 0.78 |
| 2-5 | $HSi(Me)_2O[Si(Me)_2O]_{100}Si(Me)_2H$ | 1-1 | 0.076 | 0 | fluid | 21.1 |
| 2-6 | $HSi(Me)_2O[Si(Me)_2O]_{17}Si(Me)_2H$ | 1-1 | 0.197 | 0.112 | fluid | 1.95 |
| 2-7 | $HSi(Me)_2O[Si(Me)_2O]_{17}Si(Me)_2H$ | 1-4 | 0.216 | 0.112 | fluid | 0.51 |
| C2-8 | $HSi(Me)_2O[Si(Me)_2O]_{17}Si(Me)_2H$ | 1-5 | 0.395 | 0 | gum | NA |

TABLE 3

Preparation and characterization of thermally conductive grease compositions.

| Sample | Fluid | Wt parts fluid | Wt parts $C_{18}Si(OMe)_3$ | Wt parts filler 1 | Wt parts filler 2 | Wt parts filler 3 | Eta at 1S-1, 25° C., poise | BLT mm |
|---|---|---|---|---|---|---|---|---|
| 3-1 | 2-1 | 4.14 | 0.25 | 60.7 CB-A09S | 20.6 ABY-499 | 14.3 Kadox911 | 19736 | Not tested |
| 3-2 | 2-2 | 4.14 | 0.25 | 60.7 CB-A09S | 20.6 ABY-499 | 14.3 Kadox911 | 47152 | Not tested |
| 3-3 | 2-3 | 4.14 | 0.25 | 60.7 CB-A09S | 20.6 ABY-499 | 14.3 Kadox911 | 22642 | Not tested |
| 3-4 | 2-4 | 4.14 | 0.25 | 60.7 CB-A09S | 20.6 ABY-499 | 14.3 Kadox911 | 2203 | 0.015 |
| C3-5 | 2-5 | 4.14 | 0.25 | 60.7 CB-A09S | 20.6 ABY-499 | 14.3 Kadox911 | Too hard to test | Not tested |
| 3-6 | 2-6 | 4.14 | 0.25 | 60.7 CB-A09S | 20.6 ABY-499 | 14.3 Kadox911 | 7410 | 0.020 |
| 3-7 | 2-7 | 4.14 | 0.25 | 60.7 CB-A09S | 20.6 ABY-499 | 14.3 Kadox911 | 1958 | 0.014 |
| 3-8 | 2-1 | 5.55 | 0.25 | 62.8 CB-A20S | 31.4 Al-43-ME | | 7617 | 0.048 |
| 3-9 | 2-2 | 5.55 | 0.25 | 62.8 CB-A20S | 31.4 Al-43-ME | | 6653 | 0.048 |
| 3-10 | 2-3 | 5.55 | 0.25 | 62.8 CB-A20S | 31.4 Al-43-ME | | 15294 | 0.049 |
| 3-11 | 2-7 | 6.86 | 0.33 | 62.11 H-3 | 30.7 Kadox 911 | | 3675 | 0.025 |

TABLE 3-continued

Preparation and characterization of thermally conductive grease compositions.

| Sample | Fluid | Wt parts fluid | Wt parts $C_{18}Si(OMe)_3$ | Wt parts filler 1 | Wt parts filler 2 | Wt parts filler 3 | Eta at 1S-1, 25° C., poise | BLT mm |
|---|---|---|---|---|---|---|---|---|
| 3-12 | 2-7 | 6.44 | 0.31 | 49.03 H-5 | 26.14 ABY-499 | 18.08 Kadox911 | 5484 | 0.023 |
| 3-13 | 2-7 | 5.71 | 0.27 | 68.37 XX-503R | 25.65 Kadox 911 | | 9197 | 0.020 |
| 3-14 | 2-7 | 18.04 | 0.86 | 81.1 Kadox 911 | | | 3076 | 0.001 |
| 3-15 | 2-7 | 4.98 | 0.25 | 35.93H-3 | 39.22 XX-503R | 19.62 Kadox 911 | 10217 | 0.015 |

Thermal resistance is not tested on samples 3-1, 3-2, 3-3, and comparative sample 3-5. Thermal resistance is measured on samples 3-4, 3-6, 3-7, 3-8, 3-9, 3-10, 3-11, 3-12, 3-13, 3-14, and 3-15. Thermal resistance of these samples ranges from 0.048 to 0.172.

TABLE 4

Preparation of amides (the weight parts of undecylenic acid are fixed at 1).

| Sample | Amine | Wt parts of amine | Melting point, ° C. |
|---|---|---|---|
| 4-1 | $CH_3(CH_2)_7NH_2$ | 0.702 | 48.5 |
| 4-2 | $CH_3(CH_2)_{11}NH_2$ | 0.914 | 55.7 |
| 4-3 | $CH_3(CH_2)_{15}NH_2$ | 1.19 | 72.0 |

TABLE 5

Preparation of amide-substituted silicones (the weight parts of silicones are fixed at 1).

| Sample | Silicone | Wt parts of amide 4-2 | Wt parts of amide 4-3 | Softening T, C. |
|---|---|---|---|---|
| 5-1 | $HSi(Me)_2O[Si(Me)_2O]_{17}Si(Me)_2H$ | 0.469 | 0 | 36 |
| 5-2 | $HSi(Me)_2O[Si(Me)_2O]_{17}Si(Me)_2H$ | 0 | 0.544 | 52 |
| 5-3 | $HSi(Me)_2O[Si(Me)_2O]_{17}Si(Me)_2H$ | 0.160 | 0.359 | 47 |
| 5-4 | $HSi(Me)_2O[Si(Me)_2O]_{100}Si(Me)_2H$ | 0 | 0.104 | 45 |

TABLE 6

Preparation of thermally conductive phase change compositions.

| Spl. No. | ADS | Wt parts ADS | Wt parts $C_{18}Si(OMe)_3$ | Wt parts filler 1 | Wt parts filler 2 | Wt parts filler 3 | Eta* at 40° C., poise | Eta* at 60° C., poise |
|---|---|---|---|---|---|---|---|---|
| 6-1 | 5-2 | 5.55 | 0.25 | 62.8 CB-A20S | 31.4 Al-43-ME | | $1.74 \times 10^8$ | $3.59 \times 10^3$ |
| 6-2 | 5-4 | 5.55 | 0.25 | 62.8 CB-A20S | 31.4 Al-43-ME | | $2.55 \times 10^6$ | $1.79 \times 10^4$ |
| 6-3 | 5-1 | 6.17 | 0.25 | 62.7 CB-A09S | 30.88 ABY-499 | | $2.37 \times 10^3$ | $1.10 \times 10^3$ |
| 6-4 | 5-2 | 6.17 | 0.25 | 62.7 CB-A09S | 30.88 ABY-499 | | $1.95 \times 10^8$ | $1.60 \times 10^5$ |
| 6-5 | 5-2 | 6.42 | 0 | 62.7 CB-A09S | 30.88 ABY-499 | | $2.19 \times 10^8$ | $3.51 \times 10^5$ |
| 6-6 | 5-1 + 5-2 | 2.04 + 4.13 | 0.25 | 62.7 CB-A09S | 30.88 ABY-499 | | $1.01 \times 10^8$ | $4.42 \times 10^4$ |
| 6-7 | 5-3 | 6.17 | 0.25 | 62.7 CB-A09S | 30.88 ABY-499 | | $1.25 \times 10^7$ | $1.85 \times 10^3$ |
| 6-8 | 5-3 | 7.00 | 0.25 | 62.14 H-5 | 30.61 Kadox911 | | $4.54 \times 10^7$ | $3.42 \times 10^5$ |
| 6-9 | 5-3 | 9.00 | 0.25 | 60.8 H-10 | 29.95 ABY-499 | | $3.09 \times 10^7$ | $6.41 \times 10^2$ |
| 6-10 | 5-2 | 4.14 | 0.25 | 69.23 CB-A09S | 23.08 ABY-499 | 7.69 Kadox911 | $2.76 \times 10^8$ | $5.87 \times 10^5$ |

TABLE 7

Properties of thermally conductive pads (NA is not applicable).

| Sample | PCC | 1 cm by 1 cm pad made? | TR° C. -$cm^2$/W | BLT mm |
|---|---|---|---|---|
| 7-1 | 6-1 | Yes | 0.186 | 0.050 |
| 7-2 | 6-2 | Not possible | NA | NA |
| 7-3 | 6-3 | Not possible | NA | NA |
| 7-4 | 6-4 | Yes | 0.097 | 0.020 |
| 7-5 | 3-5 | Yes | 0.107 | 0.020 |
| 7-6 | 6-6 | Yes | 0.099 | 0.020 |
| 7-7 | 6-7 | Yes | 0.105 | 0.020 |
| 7-8 | 6-8 | Yes | 0.140 | 0.053 |
| 7-9 | 6-9 | Yes | 0.105 | 0.024 |
| 7-10 | 6-10 | Yes | 0.100 | 0.040 |

TABLE 8

Properties of thermally conductive pads carried on Al mesh or foil.

| Sample | PCC | Carrier | TR ° C. -$cm^2$/W | BLT mm |
|---|---|---|---|---|
| 8-1 | 7-1 | Al mesh | 0.275 | 0.115 |
| 8-2 | 7-4 | Al foil | 0.180 | 0.072 |

DRAWINGS

Figure 1:
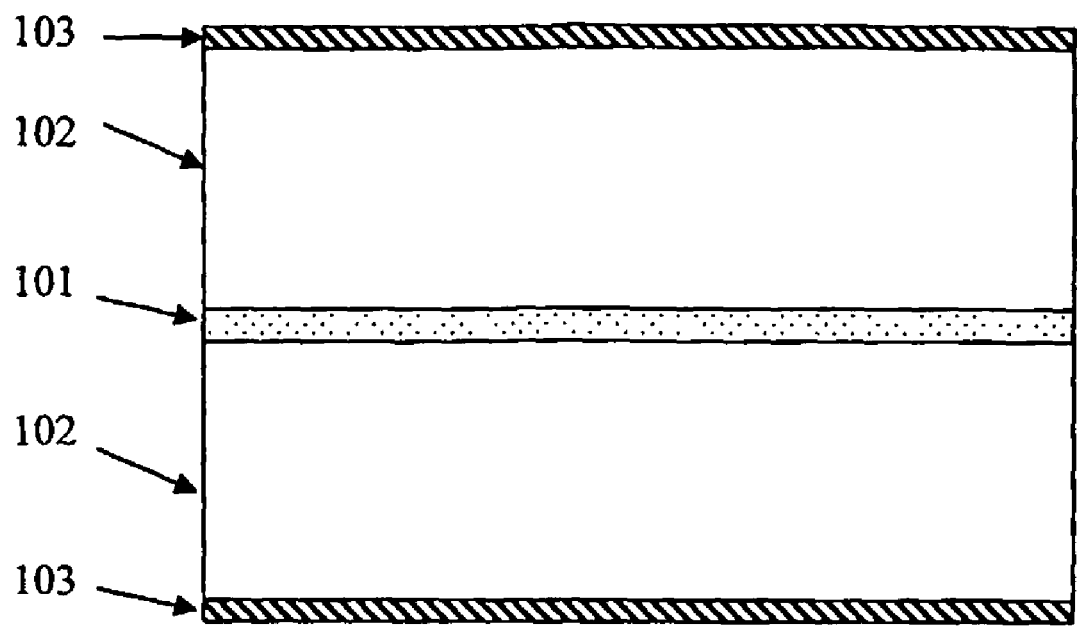
FIG. 1 is an interface material according to this invention.
Figure 2:
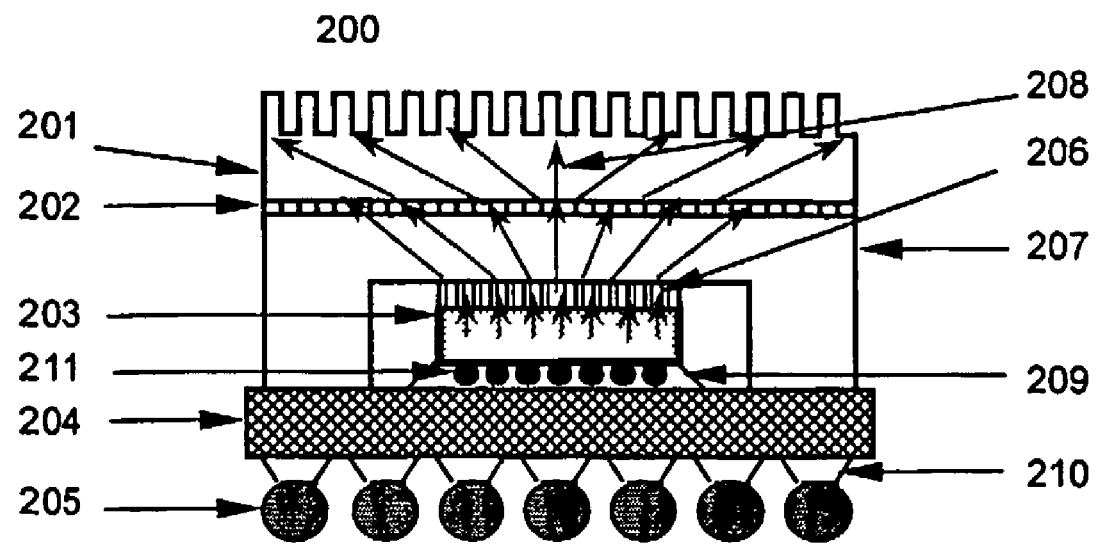
FIG. 2 is a cross section of an electronic device according to this invention.

| Reference Numerals | |
|---|---|
| 100 | device |
| 101 | heat sink |
| 102 | second interface material (TIM2) |
| 103 | integrated circuit (IC) chip |
| 104 | substrate |
| 105 | solder balls |
| 106 | first interface material (TIM1) |
| 107 | metal cover |
| 108 | thermal path represented by arrows |
| 109 | die attach adhesive |
| 110 | pads |
| 111 | spacers |

The invention claimed is:

1. An amide-substituted silicone having unit formula: $(R^2{}_a R^1{}_{3-a} SiO_{1/2})_u$ $(R^2{}_b R^1{}_{2-b} SiO_{2/2})_v$ $(R^2{}_c R^1{}_{1-c} SiO_{3/2})_w$ $(R^1{}_3 SiO_{1/2})_x$ $(R^1{}_2 SiO_{2/2})_y$ $(R^1 SiO_{3/2})_z$ $(SiO_{4/2})_{1-u-v-w-x-y-z}$, where a has a value ranging from 0 to 1, b has a value ranging from 0 to 1, c has a value ranging from 0 to 1, (a +b+c) >0, (u+x) has a value ranging from 0 to 0.4, (v+y) has a value ranging from 0.6 to 1, (w+z) has a value ranging from 0 to 0.1, each $R^1$ is independently a monovalent hydrocarbon group, each $R^2$ is independently an alkyl group having 5 to 30 carbon atoms or an amide-functional group of formula:

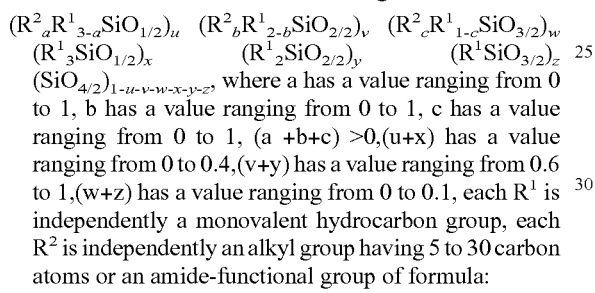

where each $R^3$ is independently a hydrogen atom, a halogen atom, or a monovalent organic group, provided, however, that at least one $R^3$ is not hydrogen, each $R^4$ is independently a hydrogen atom or a substituted or unsubstituted hydrocarbon group having 1 to 12 carbon atoms, and each $R^5$ is independently a group of formula $-(CR^3{}_2)_r R^1$, where r has a value ranging from 5 to 29, and q has a value ranging from 10 to 29, with the proviso that 1 mole % to 100 mole % of $R^2$ is the amide-functional group.

2. The amide-substituted silicone of claim 1 having a formula selected from:

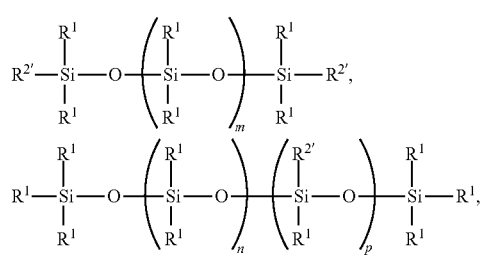

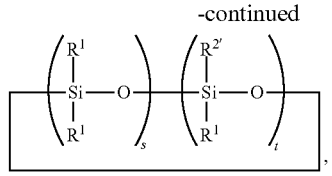

or a combination thereof, where m has a value ranging from 4 to 100, n has a value ranging from 0 to 100, p has a value ranging from 1 to 30, s has a value ranging from 0 to 7, t has a value ranging from 1 to 8, and (s+t) has a value ranging from 3 to 8.

3. A method for making an amide-substituted silicone, the method comprising:

1) heating an amine and an aliphatically unsaturated acid, acid anhydride, or acyl chloride at a temperature of at least 200° C. to form an amide,
2) adding a terminal alkene, and
3) hydrosilylation of the amide with a polyorganohydrogensiloxane having at least one silicon bonded hydrogen atom in the presence of a platinum group metal catalyst.

4. The method of claim 3, where the amine has formula

and the acid has the formula

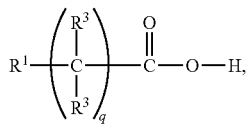

where each $R^1$ is independently an unsaturated monovalent hydrocarbon group, where each $R^3$ is independently a hydrogen atom, a halogen atom, or a monovalent organic group, provided, however, that at least one $R^3$ is not hydrogen, each $R^4$ is independently a substituted or unsubstituted hydrocarbon group having 1 to 12 carbon atoms, and each $R^5$ is independently a hydrogen atom, a monovalent hydrocarbon group having 1 to 12 carbon atoms, or a group of formula $-(CR^3{}_2)_r R^1$, where r has a value ranging from 5 to 29, and q has a value ranging from 2 to 29.

5. The method of claim 3, further comprising purifying the amide formed in step 1) before step 2).

6. A method for making an amide-substituted silicone, the method comprising:

1) heating an amine and an aliphatically unsaturated acid, acid anhydride, or acyl chloride at a temperature of at least 200° C. to form an amide, and
2) hydrosilylation of the amide with a polyorganohydrogensiloxane having at least one silicon bonded hydrogen atom in the presence of a platinum group metal catalyst, where the amine has formula

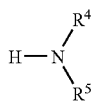

and the acid has the formula

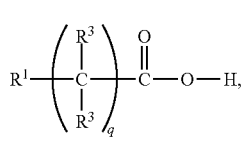

where each $R^1$ is independently an unsaturated monovalent hydrocarbon group, where each $R3$ is independently a hydrogen atom, a halogen atom, or a monovalent organic group, provided, however, that at least one $R3$ is not hydrogen, each $R^4$ is independently a substituted or unsubstituted hydrocarbon group having 1 to 12 carbon atoms, and each $R^5$ is independently a hydrogen atom, a monovalent hydrocarbon group having 1 to 12 carbon atoms, or a group of formula $-(CR^3{}_2)_rR^1$, where r has a value ranging from 5 to 29, and q has a value ranging from 2 to 29, and where the polyorganohydrogensiloxane has unit formula:

$(H_aR^1{}_{3-a}SiO_{1/2})_u$ $(H_bR^1{}_{2-b}SiO_{2/2})_v$ $(H_cR^1{}_{1-c}SiO_{3/2})_w$ $(R^1{}_3SiO_{1/2})_x$ $(R^1{}_2SiO_{2/2})_y$ $(R^1SiO_{3/2})_z$ $(SiO_{4/2})_{1-u-v-w-x-y-z}$, where a has a value ranging from 0 to 1, b has a value ranging from 0 to 1, c has a value ranging from 0 to 1, $(a+b+c)>0$, $(u+x)$ has a value ranging from 0 to 0.4, $(v+y)$ has a value ranging from 0.6 to 1, $(w+z)$ has a value ranging from 0 to 0.1, and each $R^1$ is independently a monovalent hydrocarbon group.

7. The method of claim 6, where the polyorganohydrogensiloxane containing has a formula selected from:

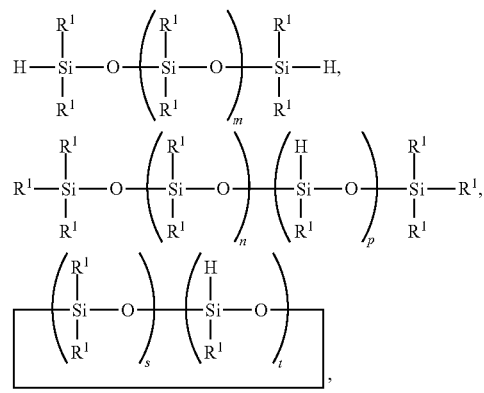

or a combination thereof, where m has a value ranging from 4 to 100, n has a value ranging from 0 to 100, p has a value ranging from 1 to 30, s has a value ranging from 0 to 7, t has a have a value ranging from 1 to 8; and (s+t) has a value ranging from 3 to 8.

* * * * *